(12) United States Patent
Best et al.

(10) Patent No.: US 11,775,706 B2
(45) Date of Patent: Oct. 3, 2023

(54) DETERMINISTIC AGENTS FOR SIMULATION

(71) Applicant: TOYOTA RESEARCH INSTITUTE, INC., Los Altos, CA (US)

(72) Inventors: Andrew Best, Los Altos, CA (US); Liang Fok, Los Altos, CA (US)

(73) Assignee: TOYOTA RESEARCH INSTITUTE, INC., Los Altos, CA (US)

(*) Notice: Subject to any disclaimer, the term of this patent is extended or adjusted under 35 U.S.C. 154(b) by 355 days.

(21) Appl. No.: 17/098,847

(22) Filed: Nov. 16, 2020

(65) Prior Publication Data
US 2022/0156432 A1    May 19, 2022

(51) Int. Cl.
*G06F 30/20* (2020.01)
*G06F 30/27* (2020.01)

(52) U.S. Cl.
CPC .............. *G06F 30/20* (2020.01); *G06F 30/27* (2020.01)

(58) Field of Classification Search
CPC .................................. G06F 30/20; G06F 30/27
See application file for complete search history.

(56) References Cited

U.S. PATENT DOCUMENTS

| 8,417,506 | B2 | 4/2013 | Sturrock |
| 2015/0007393 | A1 | 1/2015 | Palashewski |
| 2019/0130056 | A1 | 5/2019 | Tascione |
| 2021/0294944 | A1* | 9/2021 | Nassar ................... G06N 5/022 |
| 2021/0339772 | A1* | 11/2021 | Ramamoorthy ....... G06V 10/84 |
| 2021/0370980 | A1* | 12/2021 | Ramamoorthy ...... B60W 40/04 |

OTHER PUBLICATIONS

Brechtel S, Gindele T, Dillmann R. Probabilistic MDP-behavior planning for cars. In2011 14th International IEEE Conference on Intelligent Transportation Systems (ITSC) Oct. 5, 2011 (pp. 1537-1542). IEEE. (Year: 2011).*
Bi, H et al., A Data-driven Model for Lane-changing in Traffic Simulation, Eurographics/ACM SIGGRAPH Symposium on Computer Animation, 2016, pp. 1-11, ACM.
Lee, K.H. et al., Group Behavior from Video: A Data-Driven Approach to Crowd Simulation, Eurographics/ ACM SIGGRAPH Symposium on Computer Animation, Aug. 4-5, 2007, 10 pgs., ACM, San Diego, CA, USA.
Chong, L. et al., Simulation of Driver Behavior with Agent-Based Back-Propagation Neural Network; Transportation Research Record: Journal of the Transportation Research Board, 2011, pp. 44-51., No. 2249, Transportation Research Board of the National Academies, Washington, D.C., USA.

* cited by examiner

*Primary Examiner* — Chuen-Meei Gan
(74) *Attorney, Agent, or Firm* — SHEPPARD, MULLIN, RICHTER & HAMPTON LLP; Hector A. Agdeppa; Daniel N. Yannuzzi

(57) ABSTRACT

Systems and methods simulation of an ego vehicle using deterministic agents may include obtaining a set of deterministic agents for the simulation of the ego vehicle; executing the simulation of the ego vehicle using deterministic agents of the set of deterministic agents to provide simulated traffic in the simulation; determining and outputting a current state of the simulation; determining an agent action based on the determined current state; and requesting an update of a deterministic agent of the set of deterministic agents based on the determined agent action.

20 Claims, 7 Drawing Sheets

DETERMINISTIC AGENTS FOR SIMULATION

TECHNICAL FIELD

The present disclosure relates generally to vehicle simulation, and in particular, some implementations may relate to improved agents for traffic simulation.

DESCRIPTION OF RELATED ART

Autonomous vehicle technology is becoming more commonplace with the introduction of new vehicles each model year. While widespread adoption of fully autonomous vehicles is only now becoming visible on the horizon, autonomous vehicle technology is gaining increasing popularity for assisted driving and other semi-autonomous vehicle operation. Developers within organizations such as major original equipment manufacturers, tier 1 suppliers and startup companies, are racing to develop autonomous vehicle and advanced driver assistance systems (ADAS) technologies.

Autonomous vehicle safety and reliability are critical to widespread adoption and use of autonomous vehicles. Safety is evaluated and improved using functional and performance tests, including simulations of the ego vehicle operating in traffic. Simulators typically include a dynamic model of the ego vehicle, which is used to simulate behavior of the autonomous vehicle itself. Simulators typically also include the external environment in which the ego vehicle operates, which may include static and dynamic objects. Static objects may include a variety stationary traffic signs, buildings, trees, etc. Dynamic objects may include agents to represent traffic flow around the ego vehicle. Traffic in such systems is simulated using agents, which may represent other vehicles, bicycles, pedestrians or other moving objects. Dynamic objects may also include objects that are capable of changing state, even if such objects remain stationary (e.g., traffic signals).

Simulating Agent behavior has been a challenge for such systems. A typical approach is to use a rules-based agent, which is one in which the agent's behavior is defined by a set of rules. For example, rules-based agents may be configured to always follow certain traffic rules, whether dictated by law or by good practice. For example, agents may be expected to stay within marked lanes, use minimum following distances, observe maximum speeds, and so on. Thus, the rules may be based on traffic laws and best practices and may also be based on behavior of other agents or objects in the simulation. Rules-based agents are typically further configured to digest all the rules to make a binary decision. For example, where two or more rules conflict in a certain situation, the rules-based agent may use rule priorities to choose which rule to follow. For example, not hitting a pedestrian may take a higher priority than staying in the current lane of travel. Accordingly, in this example when encountered with these 2 choices, the agent would avoid hitting the pedestrian even if it meant violating the rule requiring the agent to stay in its lane of travel. Neural network simulation may use a network trained using historical movement data from rules-based agent simulations.

BRIEF SUMMARY OF THE DISCLOSURE

Various embodiments of the disclosed technology relate to deterministic based agents in vehicle simulation models in which actions of an agent are predictable for each simulation and repeatable across simulations. Such agents can be implemented as deterministic when interacting with an otherwise deterministic system. Embodiments represent an improvement over conventional rules-based or other random-behavior agents that possess some inherent randomness. Because of this inherent randomness, the way conventional rules-based agents act in a simulation can vary from one run to another, even where ego vehicle behavior and simulation system settings remain consistent. The same set of parameter values and initial conditions may lead to an ensemble of different outputs in rules-based agents simulations. This randomness may lead to difficulties in evaluating vehicle systems during typical simulations and in verifying attempted fixes.

Using deterministic agents, the output of the agent may be fully determined by parameter values and the initial conditions in deterministic agents based simulations. This can improve the functioning of the simulation system in that agent behavior can remain consistent across various simulation runs, with little or no randomness being introduced by the agents themselves. This can lead to a better understanding of ego vehicle behavior because there are fewer variables introduced by random agent behavior.

Also, the agents need not be embedded in a simulator, but can be "portable" in that they can be applied with different simulators. Each time a deterministic agent is placed in a simulation, the movement of the agent can be determined readily (e.g., subject only to randomness in ego vehicle operation or in the simulation environment itself), and therefore testing can be done in a simulation with fewer variable outcomes. This can mean that there fewer variables that could interfere with understanding ego vehicle behavior. It should be noted that while the agents themselves are not introducing additional randomness, the simulation process will not be truly deterministic where other elements of the system introduce randomness. For example, the agents may not behave fully deterministically when interacting with a non-deterministic ego vehicle. Accordingly, agents can be configured such that rather than making a binary choice between various rules, agent options are combined according to rules of combinations.

Because the outcome is determined (at least with more certainty), operation of the simulation system is improved. Also, a graph regarding what the agents are doing and/or when they will take a certain action can be generated. In deterministic agents based simulations, actions of an agent can be predictable and repeatable for each simulation, and simulation agents are data driven. As noted above, the ego vehicle stack and the simulation system may contain some non-determinism that may influence the simulation and the actions or reactions of the agents. As such, the agents might exhibit some non-deterministic behavior in such environments despite being deterministic agents.

In some embodiments, a method of simulation of an ego vehicle using deterministic agents may include: obtaining a set of deterministic agents for the simulation of the ego vehicle; executing the simulation of the ego vehicle using deterministic agents of the set of deterministic agents to provide simulated traffic in the simulation; determining and outputting a current state of the simulation; determining an agent action based on the determined current state; and requesting an update of a deterministic agent of the set of deterministic agents based on the determined agent action.

In further embodiments, a non-transitory computer-readable medium having stored thereon instructions that, when executed by one or more processors, may be configurable to cause the one or more processors to perform the operations of: obtaining a set of deterministic agents for the simulation of the ego vehicle; executing the simulation of the ego vehicle using deterministic agents of the set of deterministic agents to provide simulated traffic in the simulation; determining and outputting a current state of the simulation; determining an agent action based on the determined current state; and requesting an update of a deterministic agent of the set of deterministic agents based on the determined agent action. The non-transitory computer-readable medium of claim 11, wherein a deterministic agent of the set of deterministic agents represents another vehicle, a pedestrian, a bicycle or other dynamic actor.

A deterministic agent of the set of deterministic agents may represent another vehicle, a pedestrian, a bicycle or other dynamic actor.

The conduct of deterministic agents of the set of deterministic agents may be repeatable over a plurality of simulations.

The agents of the set of deterministic agents may be determined solely by parameter values and initial conditions.

The conduct of a deterministic agent of the set of deterministic agents may be determined based on a series of behaviors, wherein behaviors of the series of behaviors accept input from a simulation system running the simulation and, when executed, operate on the accepted input and provide an output based on the input. The behavior of the series of behaviors may further accept input from another behavior of the series of behaviors. The output of a behavior of the series of behaviors may be provided as input to another behavior of the series of behaviors. The output of the behavior may be provided to the simulation system.

Conduct of a deterministic agent of the set of deterministic agents may be determined without making a binary decision from among a plurality of rules. The agent may be a glass-box agent.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
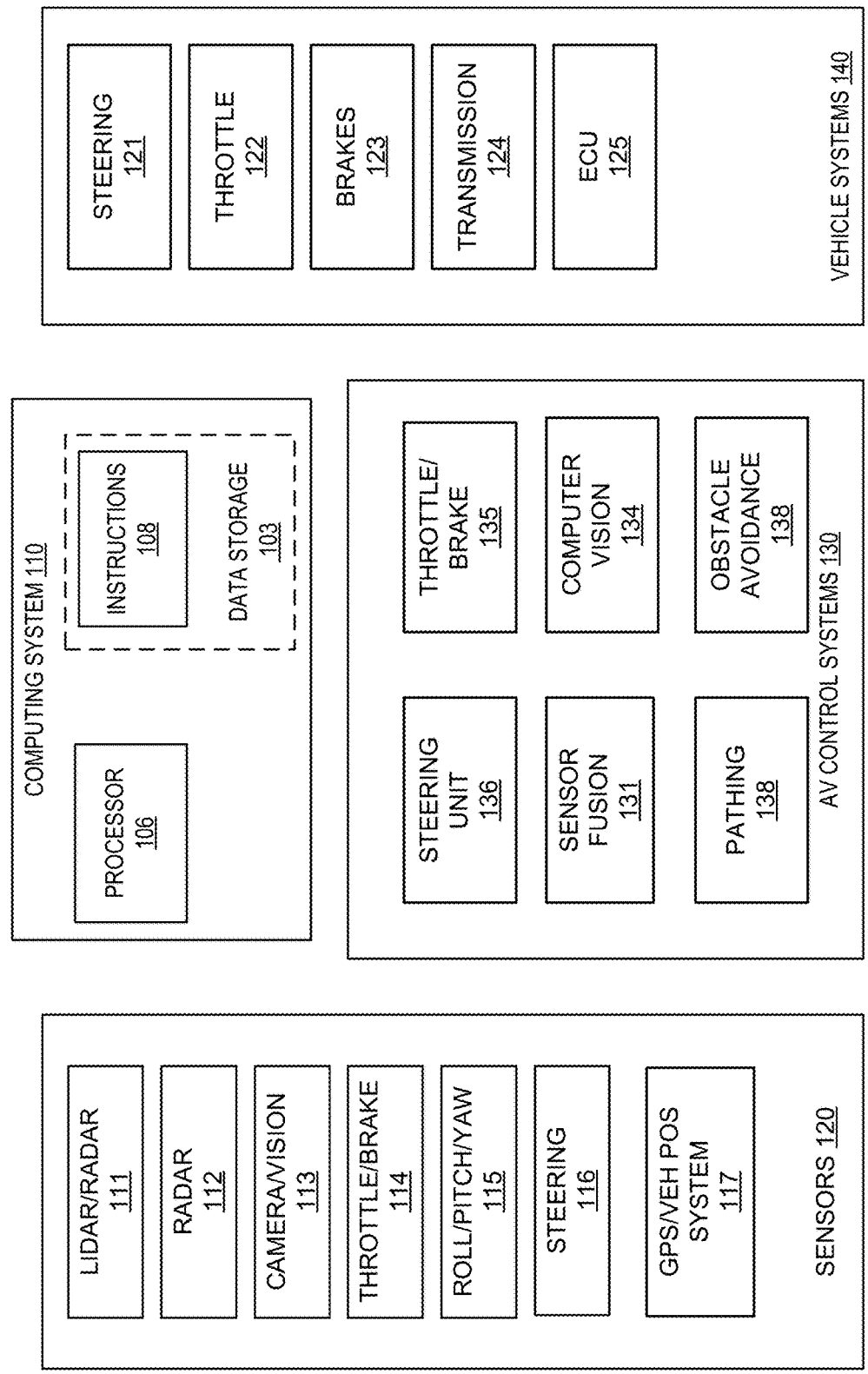
FIG. 1 illustrates an example autonomous or semi-autonomous vehicle with which embodiments of the disclosed technology may be implemented.

The figures are not exhaustive and do not limit the present disclosure to the precise form disclosed.

DETAILED DESCRIPTION

Embodiments of the systems and methods disclosed herein can provide deterministic agents that may be used in vehicle simulation models. The Agents, whether other vehicles, bicycles, pedestrians, or otherwise, can be created deterministically and plugged into simulation systems such that the actions of the agents are predictable for each simulation and repeatable across simulations. Using deterministic agents, the output of the agent may be fully determined by parameter values and the initial conditions. Each time a deterministic agent is placed in a simulation, the movement of the agent can be determined readily and reliably, meaning that testing can be done in a simulation with fewer variable outcomes. Actions of an agent are predictable and repeatable for each simulation. This can mean that there are fewer variables that could interfere with understanding ego vehicle behavior. As noted above, while the agents themselves are deterministic, the simulation process will not be truly deterministic where other elements of the system introduce randomness. For example, the agents may not behave fully deterministically when interacting with a non-deterministic ego vehicle. The randomness of the simulation is potentially affected not only by randomness in the ego vehicle stack, but also by randomness in the simulation environment.

The use of deterministic agents is not limited to simulation environments for automobiles or other vehicles, but they can also be used in other simulation environments such as, for example, for robotics systems. Deterministic agents may also be used in other environments outside of simulation such as, for example, for game engines. Deterministic agents may also be used in other applications such as, for example, to inject artificial agents into on-track testing.

In some embodiments, the agent framework is not a complete system, but may be provided as an API, library or other piece of code that can be embedded in a system to provide agents. It may be used to arbitrarily introduce new agents or a set of agents into the simulator. In some embodiments the agent system gathers the current state of simulator; calculates what an agent is going to do based on current state; and may send updated agents into simulator.

In various embodiments, agent starting position may also be deterministic and decided by algorithm at runtime (position, direction of travel etc.). Given this state data and the offline data, the same traffic patterns can be repeatable for the same ego vehicle. All variables may be known and exposed, aiding in the deterministic nature and there are no hidden states. In some embodiments, the agents may always start out of the ego vehicle's range, and an agent API may allow for this to be enforced via a user-specified minimum distance to the target. This requirement may be implemented to avoid the degenerate case where the sensing range of the ego car is so large relative to the map that there are no valid starting poses.

The systems and methods disclosed herein may be implemented with any of a number of different autonomous or semi-autonomous vehicles and vehicle types. For example, the systems and methods disclosed herein may be used with cars, trucks, buses, construction vehicles and other on- and off-road vehicles. These can include vehicles for transportation of people/personnel, materials or other items. In addition, the technology disclosed herein may also extend to other vehicle types as well. An example Autonomous Vehicle (AV) in which embodiments of the disclosed technology may be implemented is illustrated in FIG. 1.

FIG. 1 illustrates an example autonomous or semi-autonomous vehicle with which embodiments of the disclosed technology may be implemented. In this example, vehicle 100 includes a computing system 110, sensors 120, AV control systems, 130 and vehicle systems 140. Vehicle 100 may include a greater or fewer quantity of systems and subsystems and each could include multiple elements. Accordingly, one or more of the functions of the technology disclosed herein may be divided into additional functional or physical components, or combined into fewer functional or physical components. Additionally, although the systems and subsystems illustrated in FIG. 1 are shown as being partitioned in a particular way, the functions of vehicle 100 can be partitioned in other ways. For example, various vehicle systems and subsystems can be combined in different ways to share functionality.

Sensors 120 may include a plurality of different sensors to gather data regarding vehicle 100, its operator, its operation and its surrounding environment. In this example, sensors 120 include lidar 111, radar 112, or other like the distance measurement sensors, image sensors 113, throttle and brake sensors 114, 3D accelerometers 115, steering sensors 116, and a GPS or other vehicle positioning system 117. One or more of the sensors 120 may gather data and send that data to the vehicle ECU or other processing unit. Sensors 120 (and other vehicle components) may be duplicated for redundancy.

Distance measuring sensors such as lidar 111, radar 112, IR sensors and other like sensors can be used to gather data to measure distances and closing rates to various external objects such as other vehicles, traffic signs, pedestrians, light poles and other objects. Image sensors 113 can include one or more cameras or other image sensors to capture images of the environment around the vehicle as well as internal to the vehicle. Information from image sensors 113 can be used to determine information about the environment surrounding the vehicle 100 including, for example, information regarding other objects surrounding vehicle 100. For example, image sensors 113 may be able to recognize landmarks or other features (including, e.g., street signs, traffic lights, etc.), slope of the road, lines on the road, curbs, objects to be avoided (e.g., other vehicles, pedestrians, bicyclists, etc.) and other landmarks or features. Information from image sensors 113 can be used in conjunction with other information such as map data or information from positioning system 117 to determine, refined or verify vehicle location.

Throttle and brake sensors 114 can be used to gather data regarding throttle and brake application by a human or autonomous operator. Accelerometers 115 may include a 3D accelerometer to measure roll, pitch and yaw of the vehicle. Accelerometers 115 may include any combination of accelerometers and gyroscopes for the vehicle or any of a number of systems or subsystems within the vehicle to sense position and orientation changes based on inertia.

Steering sensors 116 (e.g., such as a steering angle sensor) can be included to gather data regarding steering input for the vehicle by a human or autonomous operator. A steering sensor may include a position encoder monitor the angle of the steering input in degrees. Analog sensors may collect voltage differences that can be used to determine information about the angle and turn direction, while digital sensors may use an LED or other light source to detect the angle of the steering input. A steering sensor may also provide information on how rapidly the steering wheel is being turned. A steering wheel being turned quickly is generally normal during low-vehicle-speed operation and generally unusual at highway speeds. If the driver is turning the wheel at a fast rate while driving at highway speeds the vehicle computing system may interpret that as an indication that the vehicle is out of control. Steering sensor 116 may also include a steering torque sensor to detect an amount of force the driver is applying to the steering wheel.

Vehicle positioning system 117 (e.g., GPS or other positioning system) can be used to gather position information about a current location of the vehicle as well as other positioning or navigation information.

Although not illustrated, other sensors 120 may be provided as well. Various sensors 120 may be used to provide input to computing system 110 and other systems of vehicle 100 so that the systems have information useful to operate in an autonomous, semi-autonomous or manual mode.

AV control systems 130 may include a plurality of different systems/subsystems to control operation of vehicle 100. In this example, AV control systems 130 include steering unit 136, throttle and brake control unit 135, sensor fusion module 131, computer vision module 134, pathing module 138, and obstacle avoidance module 139. Sensor fusion module 131 can be included to evaluate data from a plurality of sensors, including sensors 120. Sensor fusion module 131 may use computing system 110 or its own computing system to execute algorithms to assess inputs from the various sensors.

Throttle and brake control unit 135 can be used to control actuation of throttle and braking mechanisms of the vehicle to accelerate, slow down, stop or otherwise adjust the speed of the vehicle. For example, the throttle unit can control the operating speed of the engine or motor used to provide motive power for the vehicle. Likewise, the brake unit can be used to actuate brakes (e.g, disk, drum, etc.) or engage regenerative braking (e.g., such as in a hybrid or electric vehicle) to slow or stop the vehicle.

Steering unit 136 may include any of a number of different mechanisms to control or alter the heading of the vehicle. For example, steering unit 136 may include the appropriate control mechanisms to adjust the orientation of the front or rear wheels of the vehicle to accomplish changes in direction of the vehicle during operation. Electronic, hydraulic, mechanical or other steering mechanisms may be controlled by steering unit 136.

Computer vision module 134 may be included to process image data (e.g., image data captured from image sensors 113, or other image data) to evaluate the environment within or surrounding the vehicle. For example, algorithms operating as part of computer vision module 134 can evaluate still or moving images to determine features and landmarks (e.g., road signs, traffic lights, lane markings and other road boundaries, etc.), obstacles (e.g., pedestrians, bicyclists, other vehicles, other obstructions in the path of the subject vehicle) and other objects. The system can include video tracking and other algorithms to recognize objects such as the foregoing, estimate their speed, map the surroundings, and so on.

Pathing module 138 may be included to compute a desired path for vehicle 100 based on input from various other sensors and systems. For example, pathing module 138 can use information from positioning system 117, sensor fusion module 131, computer vision module 134, obstacle avoidance module 139 (described below) and other systems to determine a safe path to navigate the vehicle along a segment of a desired route. Pathing module 138 may also be configured to dynamically update the vehicle path as real-time information is received from sensors 120 and other control systems 130.

Obstacle avoidance module 139 can be included to determine control inputs necessary to avoid obstacles detected by sensors 120 or AV control systems 130. Obstacle avoidance module 139 can work in conjunction with pathing module 138 to determine an appropriate path to avoid a detected obstacle.

Vehicle systems 140 may include a plurality of different systems/subsystems to control operation of vehicle 100. In this example, AV control systems 130 include steering system 121, throttle system 122, brakes 123, transmission went 24, electronic control unit (ECU) 125 and propulsion system 126. These vehicle systems 140 may be controlled by AV control systems 130 in autonomous, semi-autonomous or manual mode. For example, in autonomous or semi-autonomous mode, AV control systems 130, alone or in conjunction with other systems, can control vehicle systems 140 to operate the vehicle in a fully or semi-autonomous fashion. This may also include an assist mode in which the vehicle takes over partial control or activates ADAS controls to assist the driver with vehicle operation.

Computing system 110 in the illustrated example includes a processor 106, and memory 103. Some or all of the functions of vehicle 100 may be controlled by computing system 110. Processor 106 can include one or more GPUs, CPUs, microprocessors or any other suitable processing system. Processor 106 may include one or more single core or multicore processors. Processor 106 executes instructions 108 stored in a non-transitory computer readable medium, such as memory 103.

Memory 103 may contain instructions (e.g., program logic) executable by processor 106 to execute various functions of vehicle 100, including those of vehicle systems and subsystems. Memory 103 may contain additional instructions as well, including instructions to transmit data to, receive data from, interact with, and/or control one or more of the sensors 120, AV control systems, 130 and vehicle systems 140. In addition to the instructions, memory 103 may store data and other information used by the vehicle and its systems and subsystems for operation, including operation of vehicle 100 in the autonomous, semi-autonomous or manual modes.

Although one computing system 110 is illustrated in FIG. 1, in various embodiments multiple computing systems 110 can be included. Additionally, one or more systems and subsystems of vehicle 100 can include its own dedicated or shared computing system 110, or a variant thereof. Accordingly, although computing system 110 is illustrated as a discrete computing system, this is for ease of illustration only, and computing system 110 can be distributed among various vehicle systems or components.

Vehicle 100 may also include a wireless communication system (not illustrated) to communicate with other vehicles, infrastructure elements, cloud components and other external entities using any of a number of communication protocols including, for example, V2V, V2I and V2X protocols. Such a wireless communication system may allow vehicle 100 to receive information from other objects including, for example, map data, data regarding infrastructure elements, data regarding operation and intention of surrounding vehicles, and so on. A wireless communication system may also allow vehicle 100 to transmit information to other objects. In some applications, computing functions for various embodiments disclosed herein may be performed entirely on computing system 110, distributed among two or more computing systems 110 of vehicle 100, performed on a cloud-based platform, performed on an edge-based platform, or performed on a combination of the foregoing.

The example of FIG. 1 is provided for illustration purposes only as one example of vehicle systems with which embodiments of the disclosed technology may be implemented. One of ordinary skill in the art reading this description will understand how the disclosed embodiments can be implemented with this and other vehicle platforms.

Agents in various embodiments can be provided as artificially intelligent actors, and may have a physical embodiment such as a vehicle, bicycle or pedestrian. The agents may include the capability to implement or carry out an action or a task. Agents may be configured such that they compose multiple behaviors and execute this composition of behaviors to achieve an objective. In various embodiments, the behaviors may represent units of modularity, which can be reused.

There may be several use cases for agents in a simulation. These include agents that behave plausibly in generic functional tests (i.e., intuition driven models); agents that match some human-like data traces (i.e., for a given road segment agents that do roughly what humans would do on the road segment); agents that reflect a high level safety certificate/guarantee (which may presume a limited operating domain and sufficient simplification of the problem space open paren i.e. provable agents)); and agents that are purely deterministic (i.e. totally reproducible), given a constant ego course state. These deterministic agents may employ a data-informed model for a given behavior for various use cases.

Figure 2:
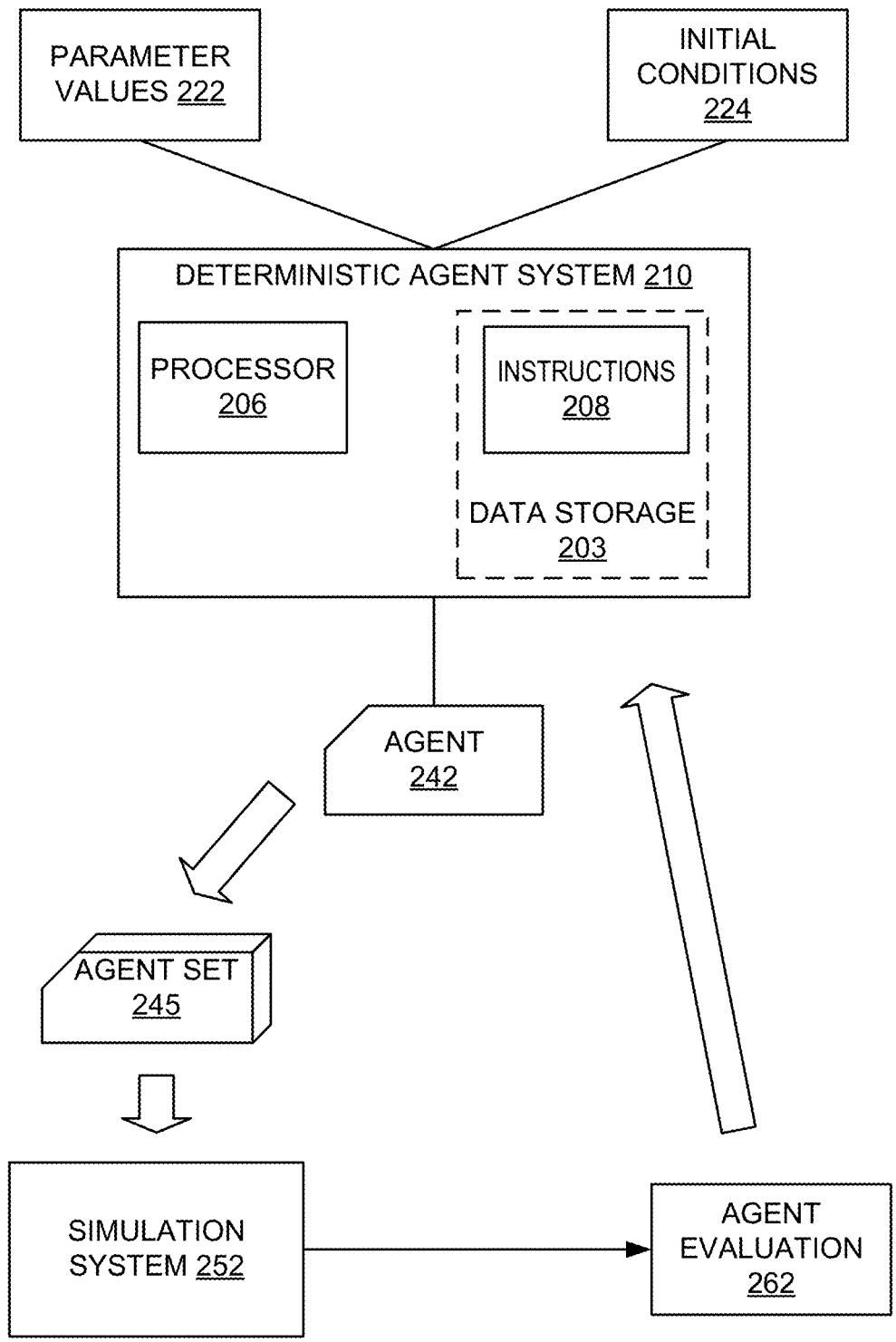
FIG. 2 is a diagram illustrating an example system for deterministic agents for traffic simulation in accordance with various embodiments.

FIG. 2 is a diagram illustrating an example system for deterministic agents for traffic simulation in accordance with various embodiments. Referring now to FIG. 2, this example includes a deterministic agent system 210 that may be employed to create deterministic agents 242. An operator may select an input one or more parameter values 222 and one or more initial conditions 224 that are used by deterministic agent system 210 to create deterministic agents 242. In various embodiments, deterministic agents are based on input parameter values 222 and initial conditions 224. Accordingly, deterministic agents 242 can be created such that their behavior does not have random aspects to it as may be the case with rules-based agents.

In the illustrated example, deterministic agent system 210 includes processor 206, and memory 203. Processor 206 can include one or more GPUs, CPUs, microprocessors or any other suitable processing system. Processor 206 may include one or more single core or multicore processors. Processor 206 executes instructions 208 stored in a non-transitory computer readable medium, such as memory 203.

Memory 203 may contain instructions (e.g., program logic) executable by processor 206 to execute various functions of vehicle 200, including those of vehicle systems and subsystems. Memory 203 may contain additional instructions as well, including instructions to transmit data to, receive data from, interact with, and/or control one or more of the sensors 220, AV control systems, 230 and vehicle systems 240. In addition to the instructions, memory 203 may store data and other information used by the vehicle and its systems and subsystems for operation, including operation of vehicle 200 in the autonomous, semi-autonomous or manual modes.

Although one deterministic agent system 210 is illustrated in FIG. 2, in various embodiments multiple deterministic agent system 210 can be included. Accordingly, although deterministic agent system 210 is illustrated as a discrete computing system, this is for ease of illustration only, and computing system 220 can be distributed among various systems or components.

Parameter values 222 used to create a deterministic agent 242 may include a set of one or more values used to govern behavior of the deterministic agent 242 being created. For example, parameter values 222 may include a schedule of actions to be taken by the deterministic agent 242 being created. This may include specific actions to be taken and the time at which the actions are to be taken.

Parameter values 222 may also include sets of agent behaviors. These may include, for example, stopping at stop lights (including profiles for deceleration/decision horizon), braking and acceleration profiles, maximum agent speed, staying in lane and between the lane markings unless a reason to change is presented, maintaining speed at the posted limit or within a certain differential from the posted speed limit, keeping a minimum distance from ego vehicle, and so on. In some embodiments, parameter values may be modified at run time.

Initial conditions 224 used to create a deterministic agent 242 may include a set of one or more conditions under which the deterministic agent 242 being created operates. Initial conditions 224 might include, for example, initial physical state of the agent 242 and initial behavior the agent 242 is going to be executing upon startup. Further to this example, initial conditions 224 may include initial vehicle location, speed and direction of travel. In some embodiments, initial conditions cannot be modified at run time.

Using parameter values 222 and initial conditions 224, Deterministic agent system 210 creates a deterministic agent 242 based on those inputs. In various embodiments, deterministic agent system 210 can use parameter values 222 and initial conditions 224 to create multiple deterministic agents 242 in form one or more agent sets 245 of deterministic agents 242.

Based on parameter values 222 and initial conditions 224, prepackaged behaviors of the agents 242 can be deterministic and predictable. Therefore, given a determined set of ego vehicle behavior and simulation system behavior can be fully predictable. However, to the extent the ego vehicle and/or simulation system are non-deterministic, agent behavior may also be non-deterministic.

The set of agents 245 can be used in a simulation of an ego vehicle being run on simulation system 252. The simulation can be initiated and run using the deterministic agents 242 instead of agents 245. Because the deterministic agents 242 are deterministic (rather than binary-decision oriented), their behavior during the simulation is predictable for given behaviors of the ego vehicle (as noted above, randomness of the ego vehicle or the simulation system may cause some non-deterministic behavior in the agents). The system may be configured to periodically review the current state of the simulation and agent behavior at that state, as illustrated by agent evaluation module 262. Depending on agent behavior, the system may recommend that a deterministic agent 242 be updated based on its behavior.

Figure 3:
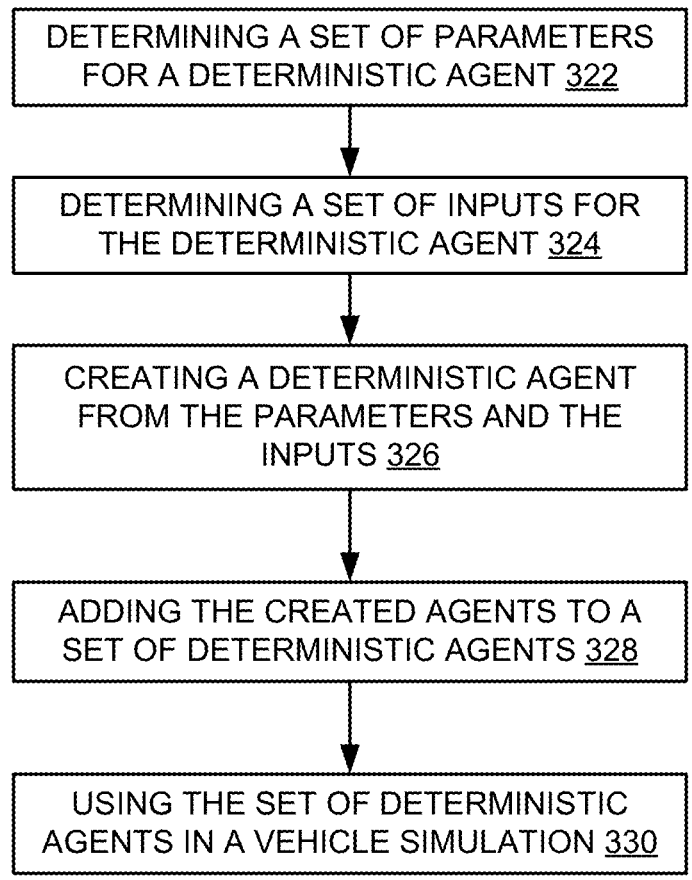
FIG. 3 is a diagram illustrating an example process for deterministic agents in accordance with various embodiments.

FIG. 3 is a diagram illustrating an example process for deterministic agents in accordance with various embodiments. With reference now to FIG. 3, at operation 322 vehicle designer determines a set of parameters (e.g. parameter values 222) for a deterministic agent being created. At operation 324, the vehicle designer may also determine a set of inputs for the deterministic agent being created.

At operation 326, the agent is created using the provided parameters and inputs. For example, deterministic agent system 210 may construct a deterministic agent using this information. Then, at operation 328, the created deterministic agent can be added to become part of a set of deterministic agents 328. The deterministic agent can be stored in a data store for future use.

At operation 330, a set of deterministic agents can be created by compiling a plurality of deterministic agents into the set and provided to a simulation system to simulate performance of an ego vehicle. The set of deterministic agents may be used for the simulation.

Figure 4:
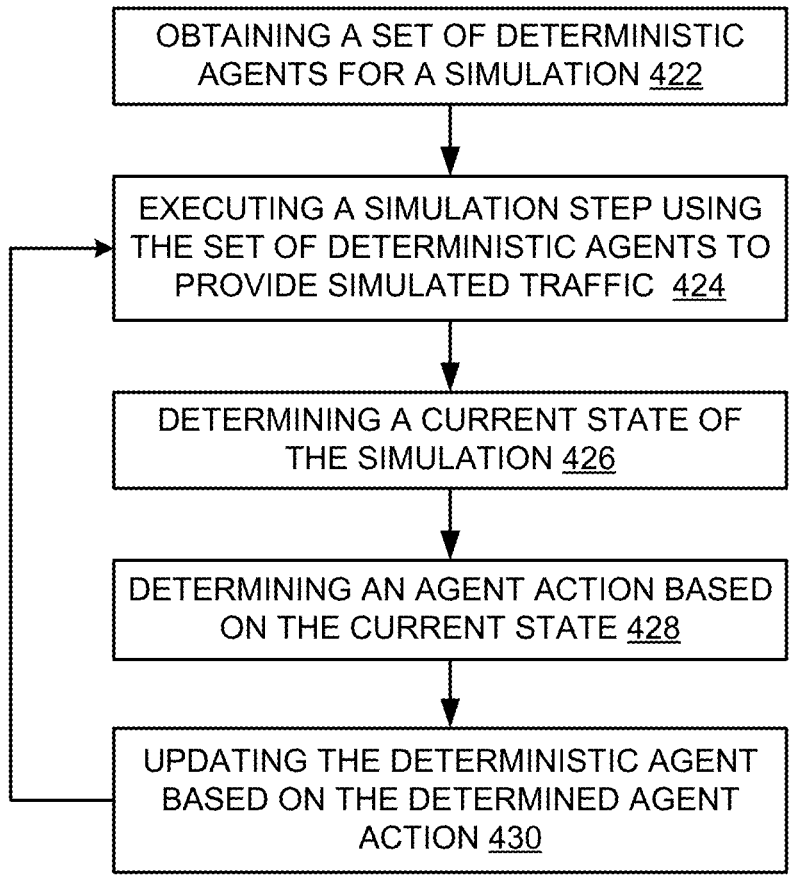
FIG. 4 is a diagram illustrating an example process for using deterministic agents in accordance with various embodiments.

FIG. 4 is a diagram illustrating an example process for using deterministic agents in accordance with various embodiments. With reference now to FIG. 4, at operation 422 a simulation operator obtains a set of deterministic agents for a simulation. As noted above, the set of deterministic agents may include one or more deterministic agents created based on parameters. Particularly, the deterministic agents may be solely created using parameters and initial conditions and may be non-rules-based agents.

At operation 424, the simulation system executes a simulation using the set of deterministic agents to provide a simulated environment. For example, the deterministic agents may be used to represent other vehicles in the ego vehicle environment. In some embodiments, when the simulation initiates, it spawns agent vehicles and registers variables, including a list of agent IDs for all agents in the simulation. Agents may be instantiated at a null location (e.g., off the map) upon startup. In some simulation environments, a traffic swarm agent is deactivated when its linear distance to the ego vehicle exceeds a defined maximum linear distance, the vehicle wasn't localized on the map, or the vehicle drove off its lane by more than a maximum lateral offset.

Activating the agents in some embodiments, includes teleporting them to a start pose/speed on the map. For determinism and performance reasons, the possible start poses may include determining them a priori by a process that may include: Omitting any portion of the road network within a user-specified buffer distance of a branch point with more than one branches; omitting any portion of the road network whose lane length is less than a user-specified minimum-lane-length value; allowing users to omit intersections with certain characteristics; and using the remaining portion of the road network, selecting possible starting poses by choosing points every separation distance, which may also be client specified.

Embodiments may include a user-specified start-pose-chooser that takes as input the target's pose, min/max distance from target, and the poses and speeds of all agents. It may return a start pose and speed, or nothing if it was unsuccessful. Internally, the start-pose-chooser may use a spatial index query to select a subset of possible start poses, and chooses a start pose and speed that does not interfere with an existing agent while abiding by road rules like direction usage rules and speed limits. The default implementation sorts the possible start poses by distance-to-target and chooses the median one, and selecting exactly the speed limit. The start-pose-chooser may be deterministic, in that there is no variance in its decision, so that given the same initial conditions it will choose the same agent placements. Embodiments may save the chosen starting pose and speed as variables and set initial values for variables such as, for example, target speed, target steering and maximum acceleration. The variables for the simulation may be applied to the actual vehicle in simulation.

In simulation, the agents may be configured to follow the road network with a user-specified branch chooser so that routing is not needed. At operation 428, the system determines an agent action based on a current simulation state. For example, this may include various agent behaviors at the then current state. At operation 430, the system may be configured to determine whether an update to the deterministic agent is warranted based on the determined agent action and to provide the agent for such update. Updates may include, for example, adding new agent behaviors, removing agent behaviors and changing the framework according to which the agent behaviors interact. For example, the agent can be modified by reordering the behavior primitive sequence, adding a behavior primitive to the agent configuration (an example of which might be to follow the lead car with more space).

As noted above, agents in various embodiments are implemented as deterministic agents, and may be configured to operate without using conventional priority-based decision-making requiring decisions to be made among which of a plurality of rules the agent should follow (e.g., like the Reynold's Boids model). Instead, agents can be implemented having an agent framework (e.g., like a contract) of operation between individual elements of an agent. Rather than having a binary choice from among sets of behaviors, the behaviors can be combined according to rules for combinations. For example, rather than making a binary choice of either avoiding a pedestrian or staying within a lane of travel, the agent may be configured to operate in accordance with a series of primitive behaviors connected together to achieve a desired performance.

The agent may still be configured to follow rules (e.g., the agent can still be required to stop at a red light), but agent behavior (e.g., what the agent is going to do) is based on a number of primitive behaviors connected in various ways based on how an agent creator wants the agent to perform. These can be configured in a sequence that obtains data from the simulation system and that is executed to determine agent output. For example, one primitive behavior required of an agent can be that the agent follow the lane markings. That behavior can have an output that is exposed, and the output can be connected to inputs of other primitive behavior modules (e.g., don't run red lights). The output of those other primitive behavior modules can be connected to inputs of further primitive behavior modules and so on. Each primitive behavior module can be configured to use the input or inputs it receives when determining agent behavior that it is going to control. Therefore, rather than specifying agent behavior, there are series of primitives with inputs and outputs that are connected together that determines agent behavior. The agents can be configured to follow multiple behavioral primitives at the same time.

For example, in a conventional binary approach, and agent approaching a pedestrian would follow a command to stop for pedestrians and compute a speed to stop for the pedestrian. The conventional agent would then ignore other commands such as, for example, a command instructing it not to run red lights. In contrast, embodiments may be implemented such that the speed computed to avoid the pedestrian would be an output of that behavior that can be fed forward into a subsequent behavior, for example, instructing the agent not to run red lights, which may further slow the agent. Thus, this is an example of result where both behaviors or rules are respected rather than choosing one rule over the other rule. Some instances may arise in operation where multiple rules may be impossible to satisfy simultaneously, but embodiments may allow the author or user to visualize the conflict.

This framework can be examined at run time and before runtime to give the user understanding of how the various components were put together. During system operation the user can view the full state of all agents during runtime to see all the agents, how their connections are put together how they are operating, and how the data is flowing. Rather than operating as black-box agents, the agents may be thought of as glass-box agents because their series of behaviors can be viewed and understood by their creators and by users.

Figure 5:
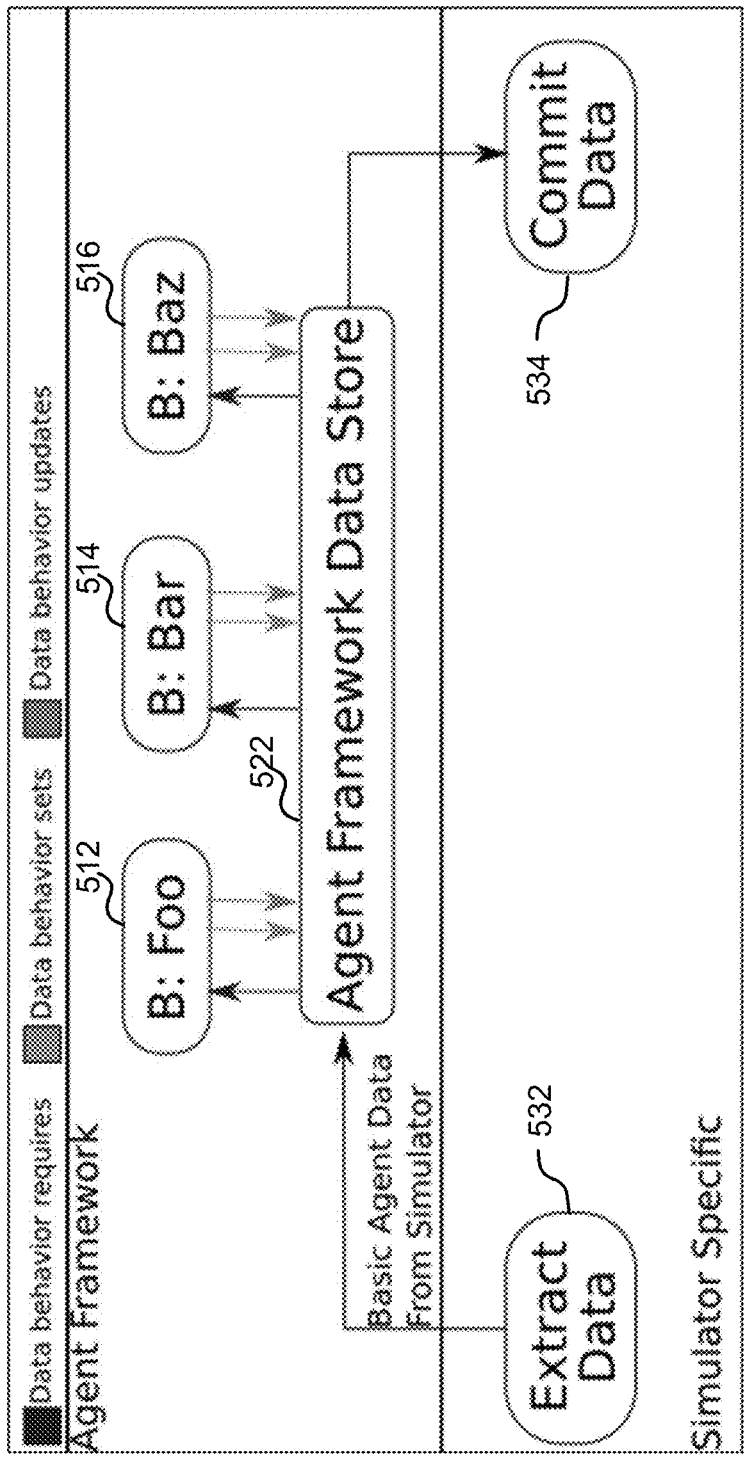
FIG. 5 is a diagram illustrating an example agent framework in accordance with various embodiments.

FIG. 5 is a diagram illustrating an example agent framework in accordance with various embodiments. This example includes three example behavior primitives, Foo, Bar and Baz. These can represent, for example, always stay within lanes, maintain a determined distance from the ego vehicle, and don't run red lights. In various embodiments, there can be many more behavior primitives for a given agent. In operation, each behavior Foo, Bar, Baz registers with agent framework data store 522. In the registration process, a behavior identifies what data it needs for operation. This can include data it needs from the simulator and other behavior primitives within the agent as well as data that it can provide to the simulator or to other behavior primitives within the sequence of behaviors within the agent. In various embodiments, the data can be provided as either a set (e.g., write new data) or an update (e.g., read and override existing data).

Agent framework data store 522 extracts data from the simulator according to the extract data operation 532, and commits data for the simulation as shown at operation 534. Required data is provided to the agent (as illustrated by the up arrows) to pre-populate the agents for operation. This can be done at each timestamp in the simulator so that the required data can be pre-populated for an upcoming simulation operation. Accordingly, the behaviors within the agent framework can have all of the data they need from the simulator in advance of the operation. During the operation, data behavior sets and updates are generated. These outputs can be provided from one behavior to another behavior as specified by the framework. Once the agents perform all other functions, these sets and updates can be provided from the behaviors Foo, Bar, Baz to agent framework data store 522 (as illustrated by the down arrows), and ultimately provided to the simulation system.

Accordingly, in embodiments, the agent framework can tell the simulator what data it needs before the simulation is run and the agent framework can tell the simulator the datatypes that is expecting to deliver in terms of sets and updates as well. If the simulator system can provide the requested data as well as accept the data to be delivered from the agent framework, the agents in the framework will be able to work within the simulator. Accordingly, the systems can determine whether the agents can be plugged into a particular simulator system based on the data required for the agent framework to operate the agents and the data the agent framework is expecting the simulation system to accept from the agents.

Likewise, the agent creator knows that it can always expect consistent data input from the simulation system because the data behavior requirements are identified as part of agent creation. This is true for each behavior as well as for the agent as a whole. Therefore, the creators of the behaviors and know that the behaviors will always get the same kind of data regardless of the simulator system the running in (assuming the simulator system can commit to providing the required data).

These behaviors can be thought of as contracts. One 'contract' is between the agent framework and the simulator, where the agent framework informs the simulator of the data the agents require from the simulator for operation, and of the data the agent framework is going to give back to the simulator system, and if the simulator system can either provide the required data and accept the data from the agent framework, the systems will be able to operate together. Another 'contract' is between behaviors within the agent specifying the inputs and outputs needed for the various behaviors as they are strung together in the framework.

Figure 6:
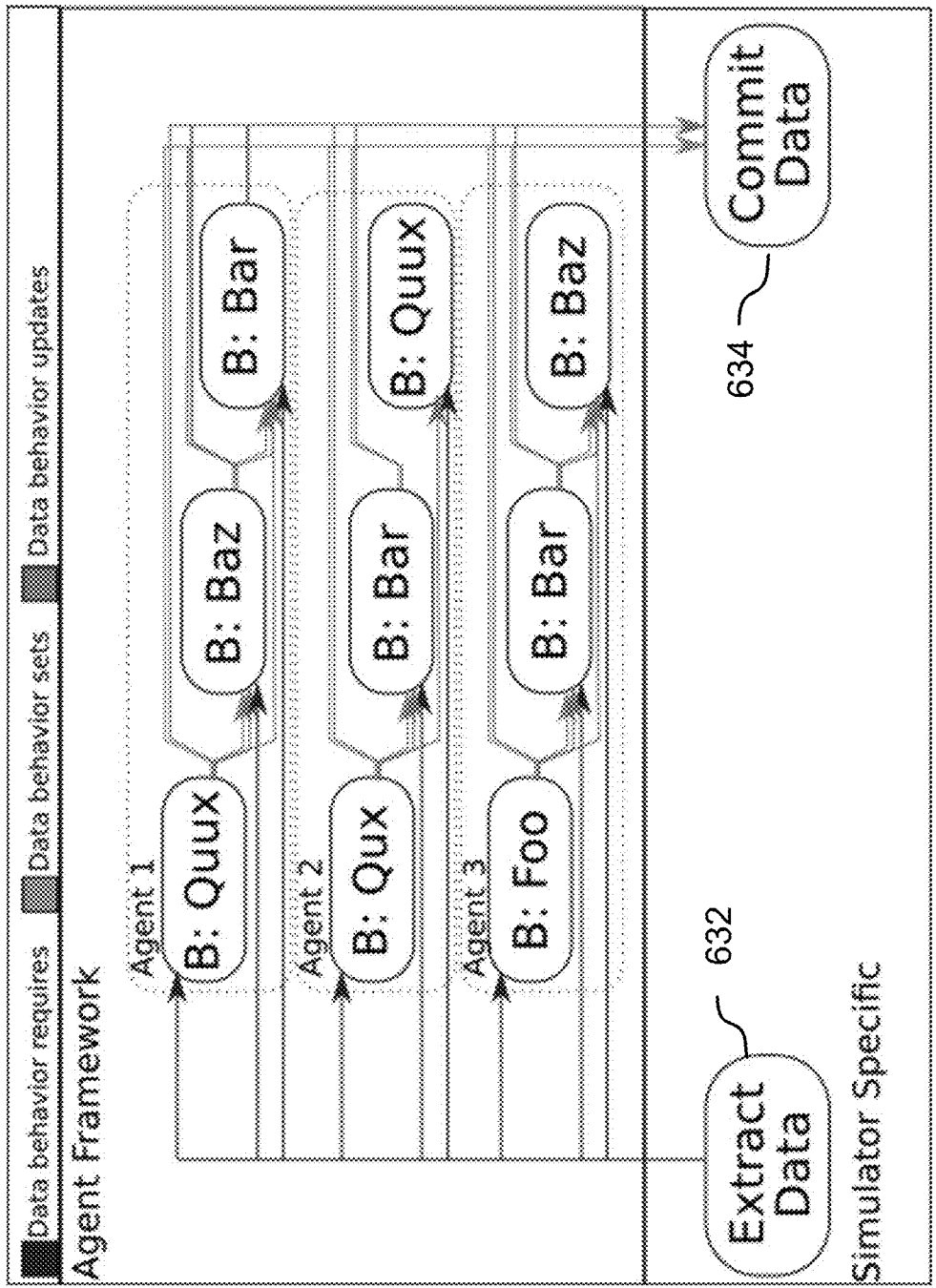
FIG. 6 is a diagram illustrating an example for agent data interaction in accordance with various embodiments.

FIG. 6 is a diagram illustrating an example for agent data interaction in accordance with various embodiments. This example includes for example behaviors Quux, Qux, Foo, Baz and Bar, and shows how data flows through the system from the simulator and between various behaviors.

In this example, agent one has three behaviors, Quux, Baz and Bar, connected in that order. Each behavior extracts data from the simulator as shown at 632. Each behavior can also register to receive data from the prior behavior instead of or in addition to from the simulator. In this example, the input of behavior Quux is from the simulator, and the input of Baz is from the simulator and from the output of behavior Quux. The output of behavior Quux in this example includes data behavior sets (writing of data) and data behavior updates (overriding existing data). Also in this example, the data overridden by each behavior is provided to the simulator to update the embodiment in the simulation. This is shown at 634. In various embodiments, not all behaviors need or use data from a prior behavior. Some behaviors can be configured to use only extract data from the simulator. When a behavior is configured, it registers for the data it needs with the framework. If that data is not set, this can be identified early in the process prior to simulation.

In various embodiments, agents may be configured such that each time the simulator advances (as may be determined by the simulator timeclock) the user may update the agents. The framework may be configured such that the simulator provides the set of basic data for all agents. As noted above, the simulator provides a set of basic data for all (or some of the) behaviors.

Figure 7:
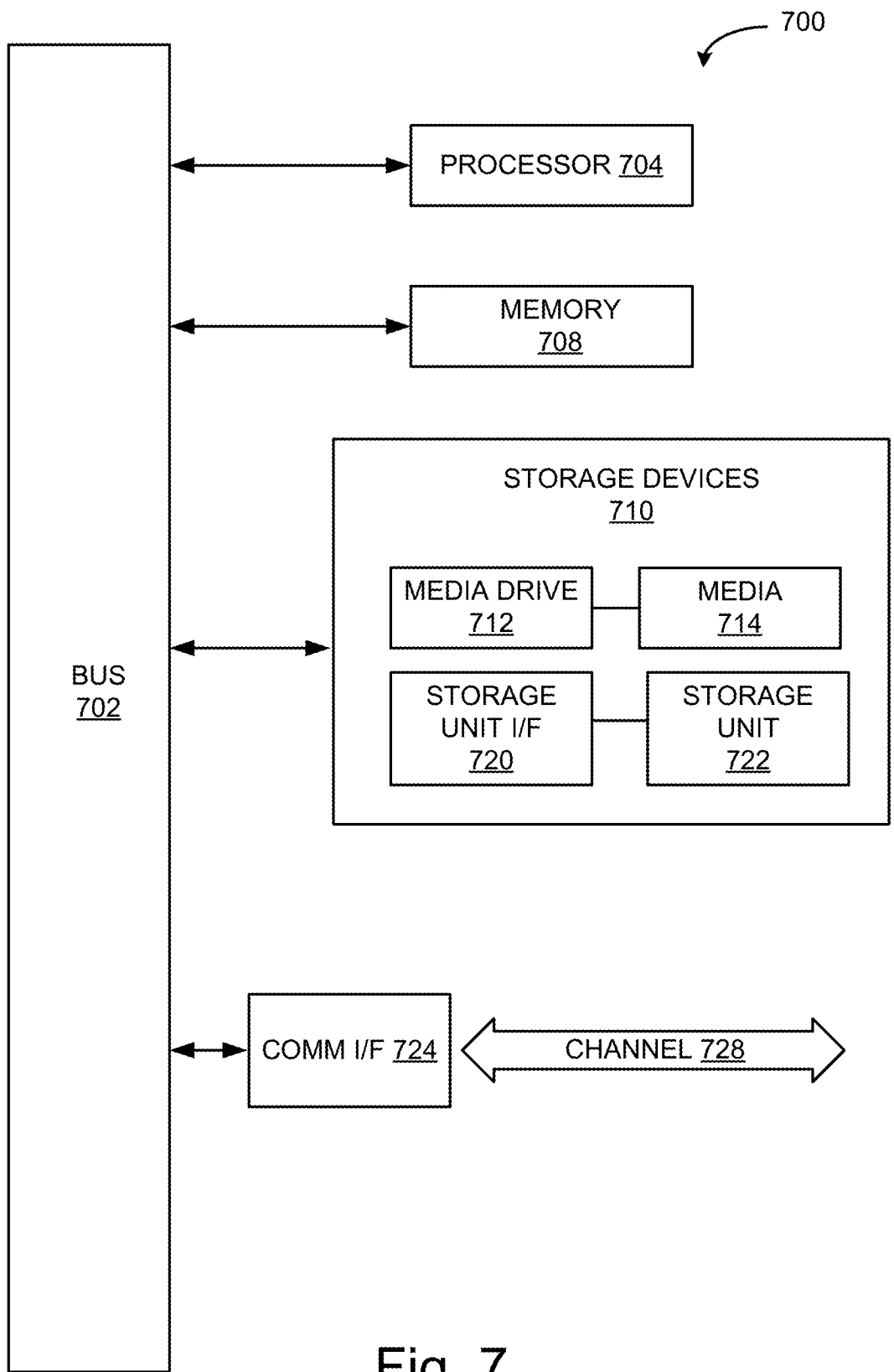
FIG. 7 is an example computing component that may be used to implement various features of embodiments described in the present disclosure.

As used herein, the term module may be used describe a given unit of functionality that can be performed in accordance with one or more embodiments of the present application. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. Various components described herein may be implemented as discrete module or described functions and features can be shared in part or in total among one or more modules. In other words, as would be apparent to one of ordinary skill in the art after reading this description, the various features and functionality described herein may be implemented in any given application. They can be implemented in one or more separate or shared modules in various combinations and permutations. Although various features or functional elements may be individually described or claimed as separate components, it should be understood that these features/functionality can be shared among one or more common software and hardware elements. Such a description shall not require or imply that separate hardware or software components are used to implement such features or functionality.

Where modules are implemented in whole or in part using software, these software elements can be implemented to operate with a computing or processing component capable of carrying out the functionality described with respect thereto. One such example computing component is shown in FIG. 7. Various embodiments are described in terms of this example-computing component 700. After reading this description, it will become apparent to a person skilled in the relevant art how to implement the application using other computing components or architectures.

Referring now to FIG. 7, computing component 700 may represent, for example, computing or processing capabilities found within a self-adjusting display, desktop, laptop, notebook, and tablet computers. They may be found in hand-held computing devices (tablets, PDA's, smart phones, cell phones, palmtops, etc.). They may be found in workstations or other devices with displays, servers, or any other type of special-purpose or general-purpose computing devices as may be desirable or appropriate for a given application or environment. Computing component 700 might also represent computing capabilities embedded within or otherwise available to a given device. For example, a computing component might be found in other electronic devices such as, for example, portable computing devices, and other electronic devices that might include some form of processing capability.

Computing component 700 might include, for example, one or more processors, controllers, control components, or other processing devices. Processor 704 might be implemented using a general-purpose or special-purpose processing engine such as, for example, a microprocessor, controller, or other control logic. Processor 704 may be connected to a bus 702. However, any communication medium can be used to facilitate interaction with other components of computing component 700 or to communicate externally.

Computing component 700 might also include one or more memory components, simply referred to herein as main memory 708. For example, random access memory (RAM) or other dynamic memory, might be used for storing information and instructions to be executed by processor 704. Main memory 708 might also be used for storing temporary variables or other intermediate information during execution of instructions to be executed by processor 704. Computing component 700 might likewise include a read only memory ("ROM") or other static storage device coupled to bus 702 for storing static information and instructions for processor 704.

The computing component 700 might also include one or more various forms of information storage mechanism 710, which might include, for example, a media drive 712 and a storage unit interface 720. The media drive 712 might include a drive or other mechanism to support fixed or removable storage media 714. For example, a hard disk drive, a solid-state drive, a magnetic tape drive, an optical drive, a compact disc (CD) or digital video disc (DVD) drive (R or RW), or other removable or fixed media drive might be provided. Storage media 714 might include, for example, a hard disk, an integrated circuit assembly, magnetic tape, cartridge, optical disk, a CD or DVD. Storage media 714 may be any other fixed or removable medium that is read by, written to or accessed by media drive 712. As these examples illustrate, the storage media 714 can include a computer usable storage medium having stored therein computer software or data.

In alternative embodiments, information storage mechanism 710 might include other similar instrumentalities for allowing computer programs or other instructions or data to be loaded into computing component 700. Such instrumentalities might include, for example, a fixed or removable storage unit 722 and an interface 720. Examples of such storage units 722 and interfaces 720 can include a program cartridge and cartridge interface, a removable memory (for example, a flash memory or other removable memory component) and memory slot. Other examples may include a PCMCIA slot and card, and other fixed or removable storage units 722 and interfaces 720 that allow software and data to be transferred from storage unit 722 to computing component 700.

Computing component 700 might also include a communications interface 724. Communications interface 724 might be used to allow software and data to be transferred between computing component 700 and external devices. Examples of communications interface 724 might include a modem or softmodem, a network interface (such as Ethernet, network interface card, IEEE 802.XX or other interface). Other examples include a communications port (such as for example, a USB port, IR port, RS232 port Bluetooth® interface, or other port), or other communications interface. Software/data transferred via communications interface 724 may be carried on signals, which can be electronic, electromagnetic (which includes optical) or other signals capable of being exchanged by a given communications interface 724. These signals might be provided to communications interface 724 via a channel 728. Channel 728 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to transitory or non-transitory media. Such media may be, e.g., memory 708, storage unit 720, media 714, and channel 728. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 700 to perform features or functions of the present application as discussed herein.

It should be understood that the various features, aspects and functionality described in one or more of the individual embodiments are not limited in their applicability to the particular embodiment with which they are described. Instead, they can be applied, alone or in various combinations, to one or more other embodiments, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like; and adjectives such as "conventional," "traditional," "normal," "standard," "known." Terms of similar meaning should not be construed as limiting the item described to a given time period or to an item available as of a given time. Instead, they should be read to encompass conventional, traditional, normal, or standard technologies that may be available or known now or at any time in the future. Where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the aspects or functionality described or claimed as part of the component are all configured in a common package. Indeed, any or all of the various aspects of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method of simulation of an ego vehicle using deterministic agents, comprising:
   obtaining a set of deterministic agents for the simulation of the ego vehicle;
   executing the simulation of the ego vehicle using deterministic agents of the set of deterministic agents to provide simulated traffic in the simulation, wherein behavior of at least one deterministic agent of the set of deterministic agents is based on rules and further based on a plurality of primitive behaviors that are configured in a sequence and that are executed in the simulation to determine agent performance;
   determining and outputting a current state of the simulation;
   determining an agent action based on the determined current state; and
   requesting an update of the at least one deterministic agent of the set of deterministic agents based on the determined agent action, wherein the update of the at least one deterministic agent of the set of deterministic agents comprises reordering the sequence of the plurality of primitive behaviors.

2. The method of claim 1, wherein the at least one deterministic agent of the set of deterministic agents represents another vehicle, a pedestrian, a bicycle or other dynamic actor.

3. The method of claim 1, wherein conduct of the at least one deterministic agent of the set of deterministic agents is repeatable over a plurality of simulations.

4. The method of claim 1, wherein the at least one deterministic agent of the set of deterministic agents is determined solely by parameter values and initial conditions, wherein the parameter values comprise parameter values of that deterministic agent.

5. The method of claim 1, wherein conduct of the at least one deterministic agent of the set of deterministic agents is determined based on a series of behaviors, wherein behaviors of the series of behaviors accept input from a simulation system running the simulation and, when executed, operate on the accepted input and provide an output based on the input.

6. The method of claim 5, wherein a behavior of the series of behaviors further accepts input from another behavior of the series of behaviors.

7. The method of claim 5, wherein the output of a behavior of the series of behaviors is provided as input to another behavior of the series of behaviors.

8. The method of claim 5, wherein the output of the behavior is provided to the simulation system.

9. The method of claim 1, wherein conduct of the at least one deterministic agent of the set of deterministic agents is determined without making a binary decision from among a plurality of rules.

10. The method of claim 5, wherein the at least one agent of the set of deterministic agents is a glass-box agent.

11. A non-transitory computer-readable medium having stored thereon instructions that, when executed by one or more processors, are configurable to cause the one or more processors to perform the operations comprising:
obtaining a set of deterministic agents for the simulation of the ego vehicle;
executing the simulation of the ego vehicle using deterministic agents of the set of deterministic agents to provide simulated traffic in the simulation, wherein behavior of at least one deterministic agent of the set of deterministic agents is based on rules and further based on a plurality of primitive behaviors that are configured in a sequence and that are executed in the simulation to determine agent performance;
determining and outputting a current state of the simulation;
determining an agent action based on the determined current state; and
requesting an update of the at least one deterministic agent of the set of deterministic agents based on the determined agent action, wherein the update of the at least one deterministic agent of the set of deterministic agents comprises reordering the sequence of the plurality of primitive behaviors.

12. The non-transitory computer-readable medium of claim 11, wherein the at least one deterministic agent of the set of deterministic agents represents another vehicle, a pedestrian, a bicycle or other dynamic actor.

13. The non-transitory computer-readable medium of claim 11, wherein conduct of the at least one deterministic agent of the set of deterministic agents is repeatable over a plurality of simulations.

14. The non-transitory computer-readable medium of claim 11, wherein the at least one deterministic agent of the set of deterministic agents is determined solely by parameter values and initial conditions, wherein the parameter values comprise parameter values of that deterministic agent.

15. The non-transitory computer-readable medium of claim 11, wherein conduct of the at least one deterministic agent of the set of deterministic agents is determined based on a series of behaviors, wherein behaviors of the series of behaviors accept input from a simulation system running the simulation and, when executed, operate on the accepted input and provide an output based on the input.

16. The non-transitory computer-readable medium of claim 15, wherein a behavior of the series of behaviors further accepts input from another behavior of the series of behaviors.

17. The non-transitory computer-readable medium of claim 15, wherein the output of a behavior of the series of behaviors is provided as input to another behavior of the series of behaviors.

18. The non-transitory computer-readable medium of claim 15, wherein the output of the behavior is provided to the simulation system.

19. The non-transitory computer-readable medium of claim 11, wherein conduct of the at least one deterministic agent of the set of deterministic agents is determined without making a binary decision from among a plurality of rules.

20. The non-transitory computer-readable medium of claim 15, wherein the at least one agent of the set of deterministic agents is a glass-box agent.

* * * * *